United States Patent
Yamabe (10) Patent No.: US 7,750,640 B2
(45) Date of Patent: Jul. 6, 2010

(54) ELECTROMOTIVE FORCE COMPUTING DEVICE AND STATE OF CHARGE ESTIMATING DEVICE

(75) Inventor: Norito Yamabe, Toyohashi (JP)

(73) Assignee: Panasonic EV Energy Co., Ltd., Kosai-shi (JP)

( * ) Notice: Subject to any disclaimer, the term of this patent is extended or adjusted under 35 U.S.C. 154(b) by 180 days.

(21) Appl. No.: 11/960,617

(22) Filed: Dec. 19, 2007

(65) Prior Publication Data
US 2008/0157777 A1    Jul. 3, 2008

(30) Foreign Application Priority Data
Dec. 27, 2006 (JP) .............................. 2006-353250
Nov. 12, 2007 (JP) .............................. 2007-293652

(51) Int. Cl.
*G01N 27/416* (2006.01)
(52) U.S. Cl. ......................... 324/426; 320/132; 320/149
(58) Field of Classification Search ................. 320/132, 320/149; 324/426, 427, 429, 431, 428, 432–434
See application file for complete search history.

(56) References Cited

U.S. PATENT DOCUMENTS

| | | | | |
|---|---|---|---|---|
| 5,658,682 | A * | 8/1997 | Usuda et al. | 429/92 |
| 6,388,448 | B1 * | 5/2002 | Cervas | 324/426 |
| 6,420,851 | B1 * | 7/2002 | Schoofs et al. | 320/132 |
| 6,639,385 | B2 * | 10/2003 | Verbrugge et al. | 320/132 |
| 6,661,231 | B1 * | 12/2003 | Arai et al. | 324/426 |
| 6,845,332 | B2 * | 1/2005 | Teruo | 702/63 |
| 2004/0257087 | A1 | 12/2004 | Murakami | |
| 2005/0017725 | A1 | 1/2005 | Murakami | |
| 2006/0232277 | A1 | 10/2006 | Murakami | |
| 2008/0162059 | A1 * | 7/2008 | Murakami | 702/63 |

FOREIGN PATENT DOCUMENTS

| | | |
|---|---|---|
| JP | 2000-323183 A | 11/2000 |
| JP | 2003-149307 A | 5/2003 |
| JP | 2003-197272 A | 7/2003 |
| JP | 2003-197275 A | 7/2003 |
| JP | 2005-65482 A | 3/2005 |

* cited by examiner

*Primary Examiner*—Edward Tso
*Assistant Examiner*—Ramy Ramadan
(74) *Attorney, Agent, or Firm*—Christensen O'Connor Johnson Kindness PLLC (57) ABSTRACT

Error in an electromotive force Ve of a secondary battery calculated on the basis of a polarized voltage Vp is reduced. A polarized voltage computing section acquires multiple data pairs of a current I flowing to the secondary battery and a terminal voltage V of the secondary battery with respect to the current I, calculates an integrated capacity Q by integrating the acquired current I over a predetermined period, computes the polarized voltage Vp of the secondary battery on the basis of the integrated capacity Q, a no-load voltage computing section computes a no-load voltage V0 on the basis of multiple data pairs, a subtracter computes the electromotive force Ve of the secondary battery by subtracting the polarized voltage Vp from the no-load voltage V0, an electromotive force correcting section performs correction with respect to a presently computed electromotive force Ve so that a change amount between a previously computed electromotive force Veb and the presently computed electromotive force Ve does not exceed a predetermined limiting value Vt, and an SOC estimating section estimates the state of charge of the secondary battery on the basis of the post-correction electromotive force Ve'.

6 Claims, 11 Drawing Sheets

| PREVIOUS ELECTROMOTIVE FORCE DISCHARGING SIDE | CHANGE AMOUNT ΔQ OF INTEGRATED CAPACITY Q | | | | | | | | | |
|---|---|---|---|---|---|---|---|---|---|---|
| | -6.5Ah~ 0Ah | 0Ah~ 0.7Ah | 0.7Ah~ 1.5Ah | 1.5Ah~ 2.0Ah | 2.0Ah~ 3.0Ah | 3.0Ah~ 4.0Ah | 4.0Ah~ 4.5Ah | 4.5Ah~ 5.0Ah | 5.0Ah~ 6.5Ah |
| V1-V2 | 0 | 0 | 0 | 20 | 20 | 20 | 20 | 20 | 20 |
| V2-V3 | 0 | 0.02 | 0.05 | 1 | 1 | 2 | 10 | 10 | 10 |
| V3-V4 | 0 | 0.01 | 0.02 | 0.05 | 0.05 | 0.1 | 1 | 2 | 10 |
| V4-V5 | 0 | 0.01 | 0.02 | 0.02 | 0.05 | 0.1 | 1 | 2 | 10 |
| V5-V6 | 0 | 0.01 | 0.02 | 0.02 | 0.05 | 0.1 | 1 | 2 | 10 |
| V6-V7 | 0 | 0.01 | 0.02 | 0.02 | 0.05 | 1 | 2 | 10 | 10 |
| V7-V8 | 0 | 0.01 | 0.02 | 0.02 | 0.05 | 1 | 2 | 10 | 10 |
| V8-V9 | 0 | 0.01 | 0.02 | 0.05 | 1 | 2 | 10 | 10 | 10 |
| V9-V10 | 0 | 0.02 | 0.05 | 1 | 2 | 10 | 10 | 10 | 10 |
| V10-V11 | 0 | 10 | 10 | 20 | 20 | 20 | 20 | 20 | 20 |
| V11-V12 | | | | | | | | | |

Fig. 7A

| CHARGING SIDE | CHANGE AMOUNT ΔQ OF INTEGRATED CAPACITY Q | | | | | | | | |
|---|---|---|---|---|---|---|---|---|---|
| | 6.5Ah ~ 0Ah | 0Ah ~ (-0.7Ah) | (-0.7Ah) ~ (-1.5Ah) | (-1.5Ah) ~ (-2.0Ah) | (-2.0Ah) ~ (-3.0Ah) | (-3.0Ah) ~ (-4.0Ah) | (-4.0Ah) ~ (-4.5Ah) | (-4.5Ah) ~ (-5.0Ah) | (-5.0Ah) ~ (-6.5Ah) |
| V1−V2 | 0 | 0 | 10 | 20 | 20 | 20 | 20 | 20 | 20 |
| V2−V3 | 0 | 0.02 | 0.05 | 1 | 1 | 2 | 10 | 10 | 10 |
| V3−V4 | 0 | 0.01 | 0.02 | 0.05 | 0.05 | 0.1 | 1 | 2 | 10 |
| V4−V5 | 0 | 0.01 | 0.02 | 0.02 | 0.05 | 0.1 | 1 | 2 | 10 |
| V5−V6 | 0 | 0.01 | 0.02 | 0.02 | 0.05 | 0.1 | 1 | 2 | 10 |
| V6−V7 | 0 | 0.01 | 0.02 | 0.02 | 0.05 | 1 | 2 | 10 | 10 |
| V7−V8 | 0 | 0.01 | 0.02 | 0.05 | 1 | 1 | 2 | 10 | 10 |
| V8−V9 | 0 | 0.01 | 0.02 | 0.05 | 1 | 2 | 10 | 10 | 10 |
| V9−V10 | 0 | 0.02 | 0.05 | 1 | 2 | 10 | 10 | 10 | 10 |
| V10−V11 | 0 | 0.02 | 0.05 | 1 | 2 | 10 | 10 | 10 | 10 |
| V11−V12 | 0 | 10 | 10 | 20 | 20 | 20 | 20 | 20 | 20 |
| PREVIOUS ELECTROMOTIVE FORCE | | | | | | | | | |

Fig. 7B

|  | V1 | V2 | V3 | V4 | V5 | V6 | V7 | V8 | V9 | V10 | V11 | V12 |
|---|---|---|---|---|---|---|---|---|---|---|---|---|
| 0°C OR HIGHER | 0 | 14.5 | 15.2 | 15.8 | 16.0 | 16.2 | 16.4 | 16.6 | 16.8 | 16.9 | 17.0 | 25.0 |
| -15°C OR HIGHER AND LOWER THAN 0°C | 0 | 14.5 | 15.2 | 15.8 | 16.1 | 16.4 | 16.8 | 17.1 | 17.3 | 17.4 | 17.5 | 25.0 |
| LOWER THAN -15°C | 0 | 14.5 | 15.2 | 15.8 | 16.2 | 16.8 | 17.2 | 17.5 | 17.7 | 17.9 | 18.0 | 25.0 |

ELECTROMOTIVE FORCE COMPUTING DEVICE AND STATE OF CHARGE ESTIMATING DEVICE

PRIORITY INFORMATION

This application claims priority to Japanese Patent Applications No. 2006-353250 filed on Dec. 27, 2006 and No. 2007-293652 filed on Nov. 12, 2007, which are incorporated herein by reference in its entirety.

BACKGROUND OF THE INVENTION

1. Field of the Invention

The present invention relates to an electromotive force computing device for computing electromotive force of a secondary battery and a state of charge estimating device for estimating the state of charge of the secondary battery on the basis of the electromotive force of the secondary battery computed by the electromotive force computing device.

2. Description of the Related Art

An electric vehicle, such as a pure electric vehicle (PEV) or a hybrid electric vehicle (HEV) obtaining vehicular driving force from an electric motor, has a secondary battery installed. The electric motor is driven by electric power stored in the secondary battery. Such an electric vehicle is equipped with regenerative braking, namely, a braking function having the electric motor function as a generator during vehicular braking where the kinetic energy of the vehicle is converted into electrical energy. The converted electrical energy is stored into the secondary battery and recycled, such as when performing acceleration.

Since battery performance deteriorates when the secondary battery is over-discharged or over-charged, it is necessary to adjust the charging or discharging operation by recognizing the state of charge (SOC) of the secondary battery. In particular, in a hybrid electric vehicle of the type where a generator is driven by a vehicle-mounted heat engine to generate electric power and the electric power charges the secondary battery, the state of charge may be controlled to an approximate intermediate area (50%-60%) between a fully charged state (100%) and a completely discharged state (0%) so that the secondary battery can receive the regenerative power and so that power can be immediately supplied to a motor if so demanded. In this case, it is preferable to more accurately detect the SOC of the secondary battery.

Japanese Patent laid-Open Publication No. 2003-197272 discloses a method for measuring a charging/discharging current for a secondary battery, multiplying the current value (having a negative symbol for charging and a positive symbol for discharging) with a predetermined charging efficiency $\eta$, calculating an integrated capacity by integrating the multiplied value over a time period, and estimating the SOC on the basis of the integrated capacity.

Japanese Patent Laid-Open Publication No. 2003-197272 improves the accuracy of the estimated SOC by correcting the charging efficiency $\eta$ in accordance with an electromotive force Ve of the secondary battery. However, to improve the accuracy of the SOC by correcting the charging efficiency $\eta$ in this manner, it becomes important to precisely calculate the electromotive force Ve, which is to be a correction parameter for the charging efficiency $\eta$.

The electromotive force Ve is, for example, obtained in the following manner. Namely, multiple data pairs of terminal voltage V and charging/discharging current I of the secondary battery during a predetermined period (for example, 60 seconds) are stored, a primary approximation line (voltage V-current I approximation line) is obtained from regression analysis, and a V intercept of the V-I approximation line is obtained as a no-load voltage V0. Furthermore, an integrated capacity Q is calculated by integrating current I over a predetermined period, a polarized voltage Vp of the battery is obtained on the basis of a change amount $\Delta Q$ of the integrated capacity Q during the predetermined period and a battery temperature T, and the electromotive force Ve is obtained by subtracting the polarized voltage Vp from the no-load voltage V0 (refer to Japanese Patent Laid-Open Publication No. 2003-197275).

As described hereinabove, the accuracy of the calculated electromotive force Ve can be improved by calculating the electromotive force Ve while taking the polarized voltage Vp into consideration. However, as shown in FIG. 2 of Japanese Patent Laid-Open Publication No. 2003-197275, the polarized voltage Vp varies with a delay of several tens of seconds from the change amount $\Delta Q$ of the integrated capacity. This delay also generates a temporal deviation in the relationship between the no-load voltage V0 and the polarized voltage Vp. Thus, unless this temporal deviation is taken into consideration, an error develops in the electromotive force Ve that is obtained by subtracting the polarized voltage Vp from the no-load voltage V0.

A process for correcting the time delay for the polarized voltage Vp in the procedure for calculating the electromotive force Ve is disclosed in Japanese Patent Laid-Open Publication No. 2003-197272 and Japanese Patent Laid-Open Publication No. 2003-197275.

SUMMARY OF THE INVENTION

However, even if a process is performed to correct the time delay for the polarized voltage Vp when calculating the electromotive force Ve as disclosed in Japanese Patent Laid-Open Publication No. 2003-197272 and Japanese Patent Laid-Open Publication No. 2003-197275, the correction is insufficient and an error may develop in the calculated electromotive force Ve.

It is therefore an object of the present invention to reduce the error in the electromotive force Ve of the secondary battery obtained from calculation.

An electromotive force computing device relating to the present invention comprises an electromotive force computing section for computing an electromotive force of a secondary battery with time on the basis of a no-load voltage V0 expressing a terminal voltage of the secondary battery when current flowing to the secondary battery is zero and a polarized voltage Vp of the secondary battery, and an electromotive force correcting section for correcting an electromotive force Ve so that a change amount does not exceed a predetermined limiting value Vt when the change amount of the electromotive force Ve presently computed with respect to a previously computed electromotive force Veb exceeds the limiting value Vt.

According to one aspect of the electromotive force computing device relating to the present invention, the electromotive force computing section comprises a no-load voltage computing section for acquiring, over a predetermined period, multiple data pairs of a current I flowing to the secondary battery and a terminal voltage V of the secondary battery with respect to the current I and computing the no-load voltage V0 from statistical processing on the basis of the acquired multiple data pairs, and a polarized voltage computing section for calculating an integrated capacity Q by integrating the current I over the predetermined period and for computing the polarized voltage Vp on the basis of an integrated capacity change amount $\Delta Q$, which is the difference with a previous integrated capacity Q.

According to one aspect of the electromotive force computing device relating to the present invention, the electromotive force correcting section performs correction by adding the limiting value Vt to the electromotive force Veb when the secondary battery is charging, and by subtracting the limiting value Vt from the electromotive force Veb when the secondary battery is discharging.

According to one aspect of the electromotive force computing device relating to the present invention, the electromotive force correcting section sets the limiting value Vt with at least one of the electromotive force Veb, change amount $\Delta Q$ in integrated capacity Q of the secondary battery in the predetermined period, battery temperature of the secondary battery, or state of charge of the secondary battery as a parameter.

The electromotive force computing device relating to the present invention comprises an electromotive force computing section for computing electromotive force of a secondary battery with time for which charging or discharging is controlled so that a state of charge is maintained in a predetermined allowable range, and an electromotive correcting section for correcting the electromotive force Ve so that a change amount of an electromotive force Ve presently computed with respect to an electromotive force Veb previously computed does not exceed a limiting value Vt set in accordance with the state of charge of the secondary battery.

According to a state of charge estimating device relating to the present invention for estimating the state of charge of a secondary battery on the basis of electromotive force of the secondary battery acquired from the electromotive force computing device, the state of charge of the secondary battery is estimated on the basis of a post-correction electromotive force Ve' when the change amount of electromotive force exceeds the limiting value Vt, and state of charge of the secondary battery is estimated on the basis of the electromotive force Ve when said change amount of electromotive force does not exceed the limiting value Vt.

According to the present invention, error in an electromotive force Ve of a secondary battery obtained by computation can be reduced.

Furthermore, according to one aspect of the present invention, correction is performed so that an allowable change amount is not exceeded with the previous electromotive force Veb as reference with respect to the electromotive force Ve computed on the basis of the no-load voltage V0 and the polarized voltage Vp. As a result, an error in the electromotive force developed from temporal deviation between the no-load voltage V0 and the polarized voltage Vp can be suppressed.

DETAILED DESCRIPTION OF THE PREFERRED EMBODIMENTS

An embodiment specifically showing a best mode for implementing the present invention will be exemplified as a hybrid electric vehicle with reference to the attached drawings. It should be noted that although a hybrid electric vehicle is exemplified as one type of electric vehicle in the embodiment, the embodiment is also applicable to other electric vehicles equipped with a motor/generator as the driving source.

Figure 1:
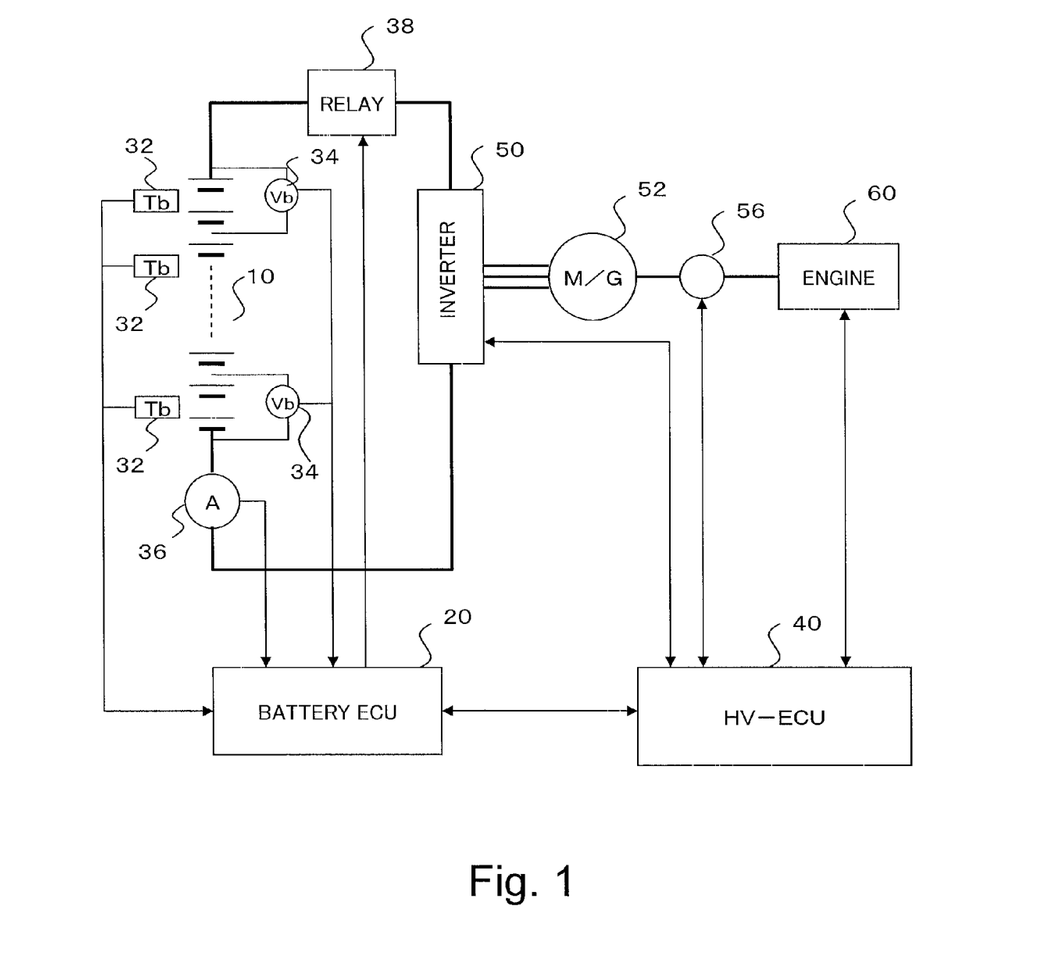
FIG. 1 shows a block diagram of a hybrid electric vehicle relating to the embodiment.

FIG. 1 shows a block diagram of a hybrid electric vehicle relating to the embodiment. In FIG. 1, a battery electronic control unit (referred to hereinafter as battery ECU) 20 receives information, such as battery voltage and battery temperature, from a secondary battery 10, estimates the SOC of the secondary battery 10 with time, and transmits information, such as the estimated SOC, battery voltage and battery temperature, to a hybrid electronic control unit (referred to hereinafter as HV-ECU) 40. The HV-ECU 40 controls an inverter 50, a driving force distribution mechanism 56, and an engine 60.

The secondary battery 10 is configured by connecting multiple battery blocks in series. Each battery block is configured by serially connecting two battery modules, and furthermore, each battery module is configured by electrically connecting six cells in series. The numbers of battery blocks, battery modules, and cells are not particularly limited to any quantity. The structure of the secondary battery is also not limited to the above-mentioned example. The secondary battery 10 is, more specifically, a nickel-metal hydride secondary battery or a lithium-ion secondary battery.

The secondary battery 10 is connected to a motor/generator 52 via a relay 38 and the inverter 50. The motor/generator 52 is connected to the engine (internal combustion) 60 via the driving force distribution mechanism 56 that includes a planetary gear mechanism.

Furthermore, a temperature sensor 32 is provided at least at one location on the secondary battery 10 and detects a battery temperature Tb of a predetermined member on the secondary battery 10. When multiple temperature sensors 32 are provided, the temperature sensors 32 are located, for example, one per group of multiple battery blocks having relatively similar temperatures. Or, one sensor may be located at every battery block having a relative temperature difference. The division into groups or the selection of a battery block to be detected may be performed by measuring the temperature of each battery block, such as from prior experimentation.

Furthermore, a voltage sensor is provided at every battery block and detects a terminal voltage Vb of each battery block. Moreover, a current sensor 36 detects a charging/discharging current I flowing to the secondary battery 10.

Temperature data Tb(n), terminal voltage data Vb(n), and current data I(n), which are output from the temperature sensor 32, the voltage sensor 34, the current sensor 36, are respectively input by the battery ECU 20 at a predetermined sampling period (for example, 100 ms). The battery ECU 20 estimates the SOC of the secondary battery 10 on the basis of the data input from the sensors.

Figure 2:
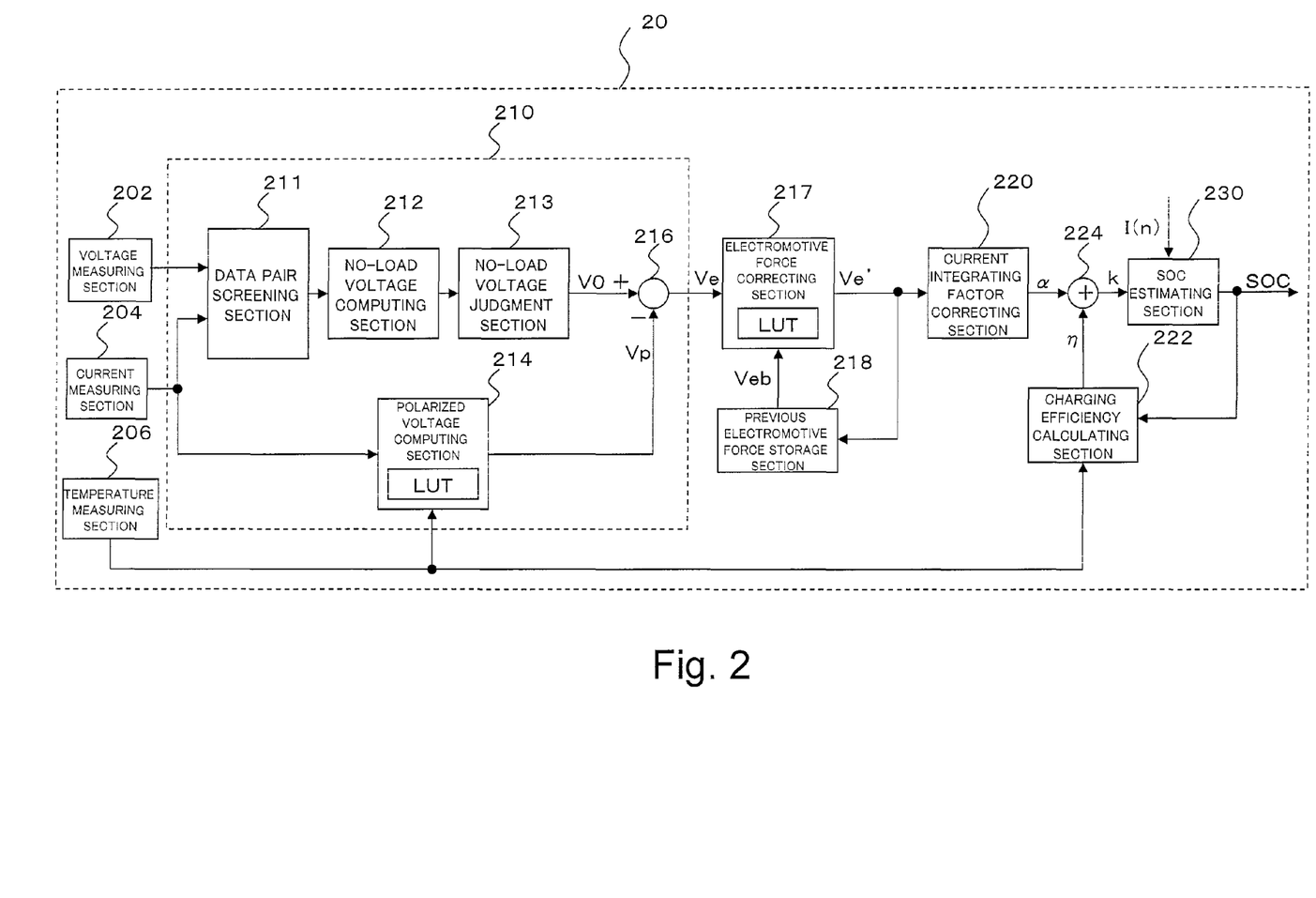
FIG. 2 shows a functional block diagram of a battery ECU relating to the embodiment.

Next, the configuration of the battery ECU 20 in the embodiment will be described with reference to the functional block diagram shown in FIG. 2.

A voltage measuring section 202 measures the voltage data V(n) of the secondary battery 10 by measuring the terminal voltage Vb of each battery block detected by each voltage sensor 34 at a predetermined sampling period (for example, 100 ms) as terminal voltage data Vb(n) and summing the terminal voltage data Vb(n) of each battery block. A current measuring section 204 measures the charging/discharging current of the secondary battery 10 detected by the current sensor 36 at a predetermined sampling period (for example, 100 ms) as current data I(n), the polarity of which signifies the charging direction or discharging direction. A temperature measuring section 206 measures a typical value (for example, average value) of temperature data Tb(n) detected by each temperature sensor 32 as temperature data T(n) of the secondary battery 10.

An electromotive force computing section 210 includes a data pair screening section 211 for calculating a no-load voltage V0, a no-load voltage computing section 212, and a no-load voltage judgment section 213, and further includes a polarized voltage computing section 214 for calculating a polarized voltage Vp.

The voltage data V(n) from the voltage measuring section 202 and the current data I(n) from the current measuring section 204 are input as data pair by the data pair screening section 211. At the data pair screening section 211, as screening conditions, the value of the current data I(n) in the charging direction (−) and the discharging direction (+) is within a predetermined range (for example, ±50 A), the number of current data I(n) items in the charging direction and the discharging direction is greater than or equal to a predetermined value (for example, 10 items among 60 samples), and if the change amount ΔQ of the integrated capacity during data pair acquisition is within a predetermined range (for example, 0.3 Ah), the pair of voltage data V(n) and current data I(n) is judged to be valid and selected to be output as a valid data pair S(V(n),I(n)).

Figure 3:
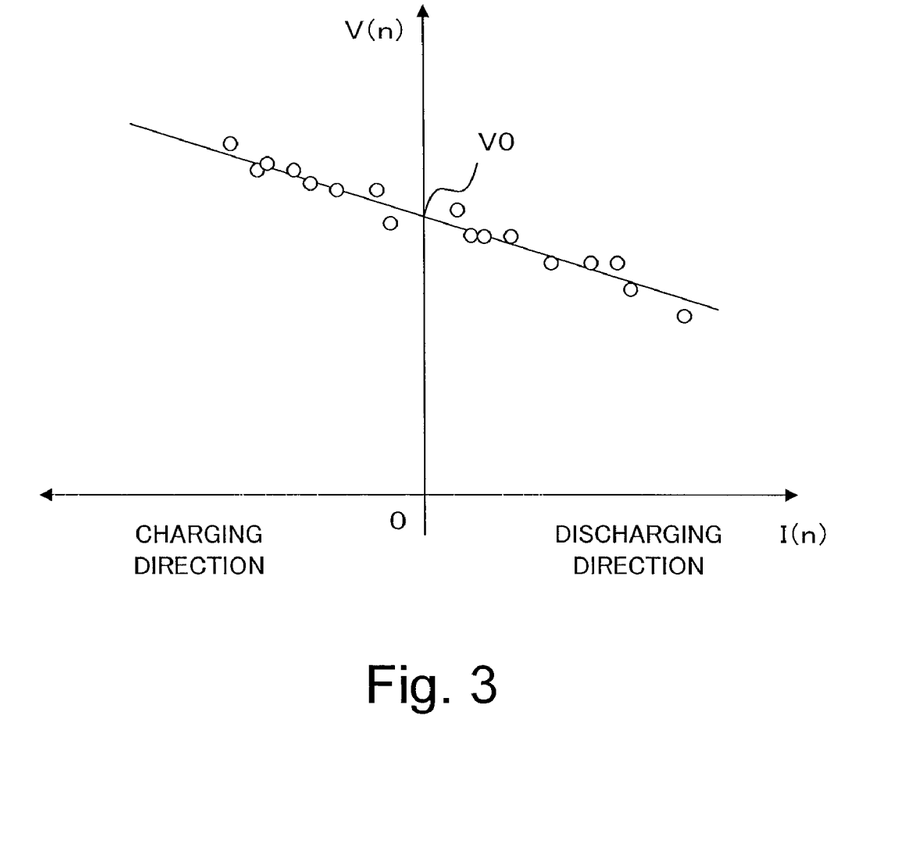
FIG. 3 shows data pairs of voltage data and current data and an approximation line for obtaining no-load voltage from a statistical process.

The valid data pair S(V(n),I(n)) output from the data pair screening section 211 is input by a no-load voltage computing section 212. As shown in FIG. 3, at the no-load voltage computing section 212, a primary voltage-current line (approximation line) is obtained from a statistical process from valid data pairs S(V(n),I(n)) and the no-load voltage V0, which is the voltage value when the current is zero (voltage (V) intercept), is calculated.

The no-load voltage V0 output from the no-load voltage computing section 212 is next input by the no-load voltage judgment section 213. At the no-load voltage judgment section 213, as a judgment condition, a variance value of data pair S(V(n),I(n)) with respect to the approximation line is obtained, whether the variance value is within a predetermined range or a correlation coefficient of the approximation line and data pair S(V(n),I(n)) is obtained, and if the correlation coefficient is greater than or equal to a predetermined value, the calculated no-load voltage V0 is judged to be valid and then output.

It should be noted that the calculation method for the no-load voltage V0 in the no-load voltage computing section 212 is not limited to the above-mentioned method.

Figure 4A:
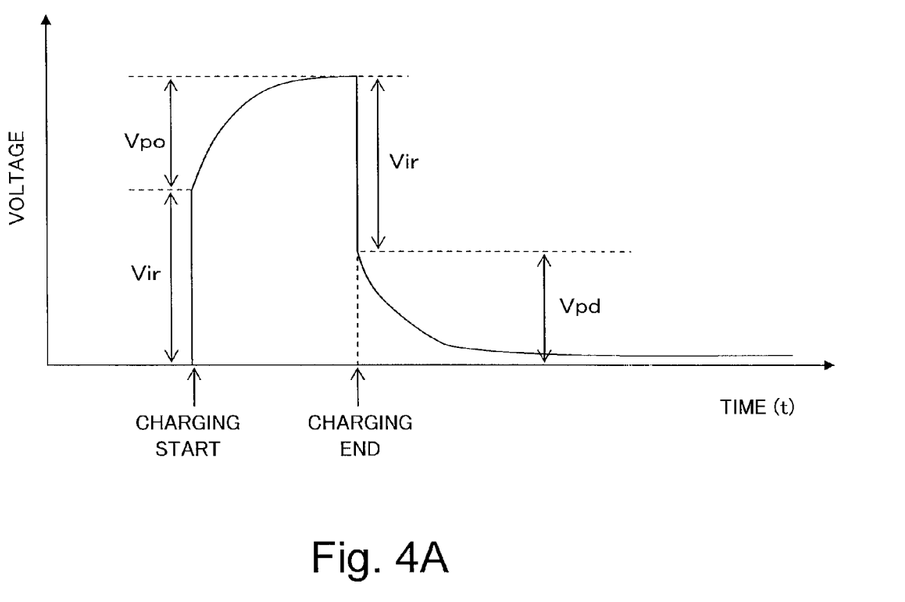
FIG. 4A illustrates a computation method for the polarized voltage Vp of the secondary battery.

On the other hand, the polarized voltage computing section 214 computes the polarized voltage Vp of the secondary battery 10. As shown in FIG. 4A, when charging of the secondary battery 10 is continued by a constant current, for example, the polarized voltage Vp gradually increases and does not immediately clear even after charging completes and gradually decreases toward zero. Namely, the polarized voltage Vp includes a polarized generation component Vpo, which is a component from the start to finish of charging by the constant current, and a polarized attenuation component Vpd (having a minus sign with respect to the polarized generation component), which is a component after charging terminates. In FIG. 4A, a voltage Vir is a voltage generated from the internal resistance of the secondary battery 10 when the charging by constant current of the secondary battery 10 begins. When discharging by constant current of the secondary battery 10 is continued, the change in voltage along time is substantially symmetrical with respect to the horizontal axis so that a detailed description will be omitted.

The polarized voltage computing section 214 respectively computes, for example, the polarized generation component Vpo and the polarized attenuation component Vpd, and sums them to compute the polarized voltage Vp.

Since the charging/discharging control of the secondary battery 10 installed in the hybrid electric vehicle actually frequently repeats charging and discharging during a short period of time, the polarized generation component Vpo is approximately obtained by multiplying an integral amount of the charging/discharging current I within a fixed time with a coefficient h and limiting it to a given value. Thus, the polarized voltage computing section 214 computes the polarized generation component Vpo from the following expression (1).

$$Vpo = h \times \smallint I \quad (1)$$

With battery temperature as a parameter, h is a polarized voltage generation coefficient calculated on the basis of a function f(T) obtained, such as from prior experimentation, and ∫I indicates a current integrated value of current data I(n), namely, an integrated capacity Q.

Figure 4B:
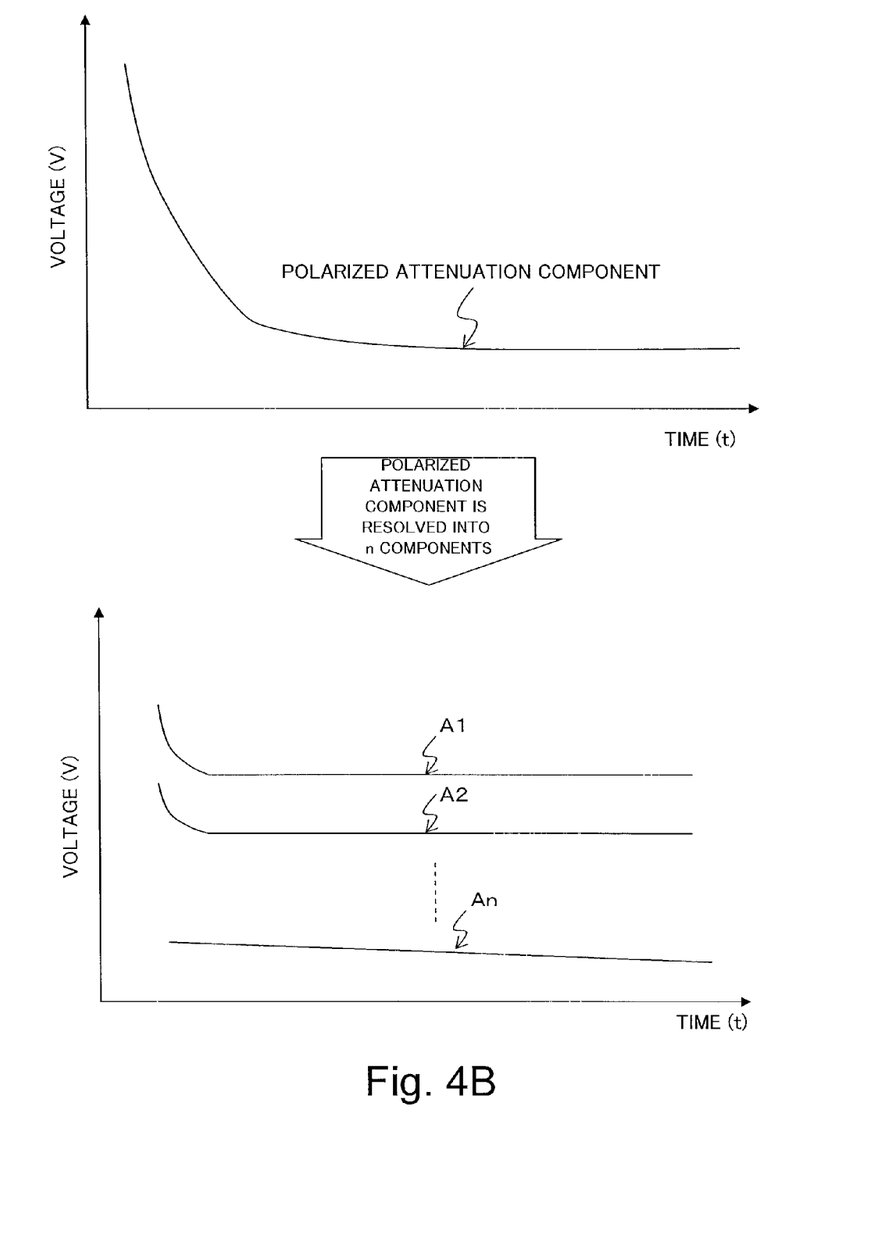
FIG. 4B illustrates a computation method for the polarized voltage Vp of the secondary battery.

Furthermore, as shown in FIG. 4B, the polarized attenuation component Vpd of a battery in general combines n components (A1, A2, . . . , An) from a short-term attenuated component to a long-term attenuated component. The polarized attenuation factor of each component is expressed as exp(−t/Tn) so that the polarized attenuation factor of the polarized voltage, which combines the components, is expressed in the following expression (2).

$$\text{Polarized attenuation factor} = A1(\exp(-t/T1) + A2(\exp(-t/T2) + A3(\exp(-t/T3) + \ldots + An(\exp(-t/Tn)) \quad (2)$$

Here, (A1, A2, . . . , An)>0 and A1+A2+ . . . +An=1. Furthermore, A1 to An and T1 to Tn are values dependent on battery characteristics and obtained from prior experimentation. Moreover, t represents the elapsed time from the end of charging or discharging of the secondary battery 10.

Since the polarized voltage generated during charging or discharging is attenuated, the polarized attenuation component Vpd can be calculated from the following expression (3).

$$Vpd = Vpo \times (A1 \times \exp(-t/T1) + A2 \times \exp(-t/T2) + A3 \times \exp(-t/T3) + \ldots + An \times \exp(-t/Tn)) \quad (3)$$

As described above the polarized voltage computing section 214 computes the polarized generation component Vpo and the polarized attenuation component Vpd on the basis of expression (1) and expression (3), then sums them to compute the polarized voltage Vp (=Vpo+Vpd).

Furthermore, besides the above-mentioned calculation method, the polarized voltage computing section 214 may, for example, calculate the polarized voltage Vp in the following manner.

Figure 5:
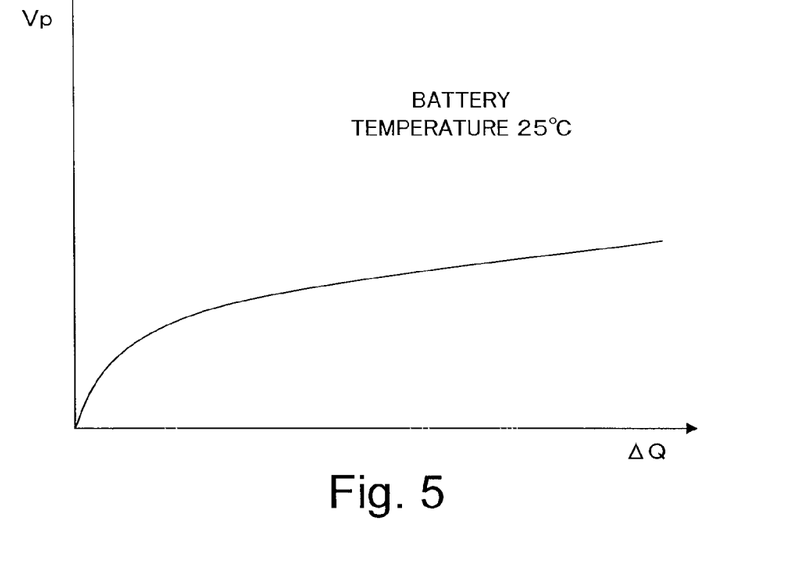
FIG. 5 shows an example of a characteristic curve of the polarized voltage Vp with respect to the change amount $\Delta Q$ with temperature as a parameter in the embodiment.

Namely, the polarized voltage computing section 214 calculates the present integrated capacity Q on the basis of current integration in a predetermined period (for example, 60 seconds) of current data I(n) input from the current measuring section 204 and obtains the change amount $\Delta Q$ of the integrated capacity, which is the difference with the integrated capacity Q in the previous predetermined period (for example, 60 seconds). Next, the polarized voltage computing section 214 calculates the polarized voltage Vp on the basis of temperature data T(n) from an expression or a characteristic curve of the polarized voltage Vp with respect to the change amount $\Delta Q$ of the integrated capacity with temperature as a parameter stored in advance in a lookup table (LUT). A characteristic curve of polarized voltage Vp with respect to $\Delta Q$ when the temperature is 25° C. is shown in FIG. 5. Although only the characteristic curve at 25° C. is shown in FIG. 5, in actuality, for example, in the case of a hybrid electric vehicle application, characteristic curves covering a range from −30° C. to +60° C. are stored in the LUT as lookup data.

It should be noted that the calculation method for the polarized voltage Vp in the polarized voltage computing section 214 is not limited to the above-mentioned method.

After calculating the polarized voltage Vp in the above-mentioned manner, the polarized voltage computing section 214 performs a time delay process with respect to the calculated polarized voltage Vp. Although described hereinafter, in the embodiment, if a temporal deviation develops between the no-load voltage V0 and the polarized voltage Vp without the time delay process sufficiently performed in the polarized voltage computing section 214, any error in the electromotive force Ve calculated on the basis thereof is suppressed.

A subtracter 216 outputs the electromotive force Ve obtained by subtracting the polarized voltage Vp, which is output from the polarized voltage computing section 214, from the no-load voltage V0, which is output from the no-load voltage judgment section 213. The electromotive force Ve that is output from the subtracter 216 is input by an electromotive force correcting section 217.

The electromotive force correcting section 217 performs correction with respect to the electromotive force Ve so as to suppress the error generated in the electromotive force Ve from the temporal deviation between the no-load voltage V0 and the polarized voltage Vp, and outputs a post-correction electromotive force Ve'.

Figure 6:
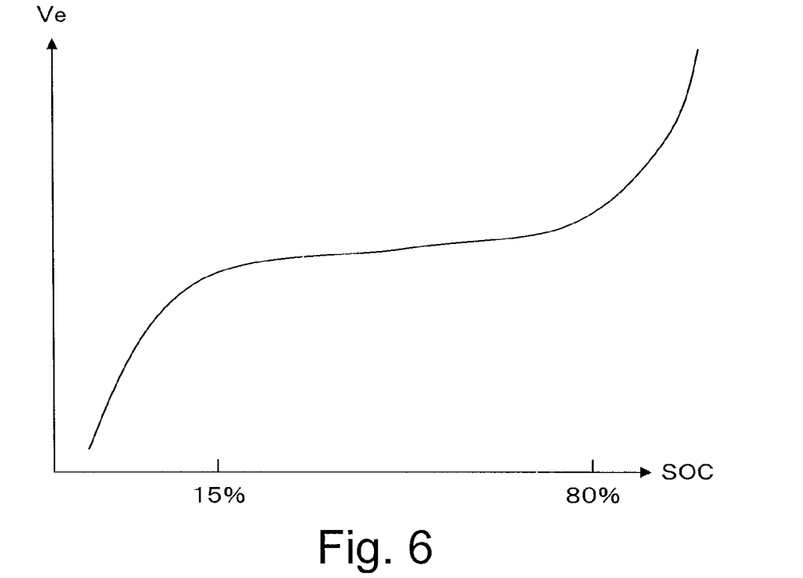
FIG. 6 shows a relationship between the electromotive force and the SOC of the secondary battery.

FIG. 6 shows the relationship between the SOC and the electromotive force Ve in a case where a nickel-metal hydride secondary battery is used as the secondary battery 10. As shown in FIG. 6, the amount of change in the electromotive force Ve depends on the amount of change in the SOC. For example, in the case of a hybrid electric vehicle, the charging or discharging of the secondary battery 10 is controlled while maintaining the SOC in an intermediate range indicating a predetermined allowable range. However, as shown in FIG. 6, the change in the electromotive force is small in the intermediate range of the SOC. Thus, for example, even though the SOC is approximately 50%, a sudden change in the electromotive force rarely occurs during normal control. For this reason, for example, even though the SOC is approximately 50%, if the present electromotive force Ve calculated after a relatively short period (for example, 60 seconds) is considerably larger than the electromotive force Ve calculated previously, namely, if the amount of change in the electromotive force is considerably large, the calculated electromotive force Ve can be considered to include considerable error.

Taking the above-mentioned SOC and electromotive force into consideration in the embodiment, the electromotive force correcting section 217 compares the previous electromotive force Veb stored in a previous electromotive force storage section 218 and the present electromotive force Ve, and if the amount of change is larger than a predetermined change limiting value Vt, the amount of change from the previous electromotive force Ve is limited to within the change limiting value Vt.

More specifically, at the charging side, if the absolute value (|Ve−Veb|) of a value, which is the previous electromotive force Veb subtracted from the electromotive force Ve, exceeds the change limiting value Vt, the post-correction electromotive force Ve' is Veb+Vt. On the other hand, at the discharging side, the absolute value (|Ve−Veb|) exceeds the change limiting value Vt, the post-correction electromotive force Ve' is Veb−Vt. If |Ve−Veb| is within the change limiting value Vt, the post-correction electromotive force Ve' is without change Ve. The secondary battery may be judged to be at the charging side or discharging side on the basis of current data I(n). Namely, if the sign of the integrated value of the current data I(n), measured during a period from when the previous electromotive force Veb is calculated to when the present electromotive force Ve is calculated, is negative, the secondary battery can be judged to be on the charging side, and if positive, on the discharging side.

Since it is satisfactory for the amount of change from the previous electromotive force Veb to be limited within the change limiting value Vt, the post-correction electromotive force Ve' need not always be Veb+Vt on the charging side and Veb−Vt on the discharging side.

The allowable amount of change in the electromotive force differs depending on the SOC value of the secondary battery or the amount of change in the SOC. Furthermore, the SOC value has a correlation with the electromotive force and the amount of change in the SOC has a correlation with the change amount $\Delta Q$ of the integrated capacity Q. Namely, the allowable amount of change in the electromotive force differs according to the magnitude of the previous electromotive force Veb and the change amount $\Delta Q$ of the integrated capacity Q during a period from when the previous electromotive force Veb is calculated to when the present electromotive force Ve is calculated. For this reason, it is preferable for the change limiting value Vt to change in accordance with the magnitude of the previous electromotive force Veb and the change amount $\Delta Q$ of the integrated capacity Q.

Figure 7A:
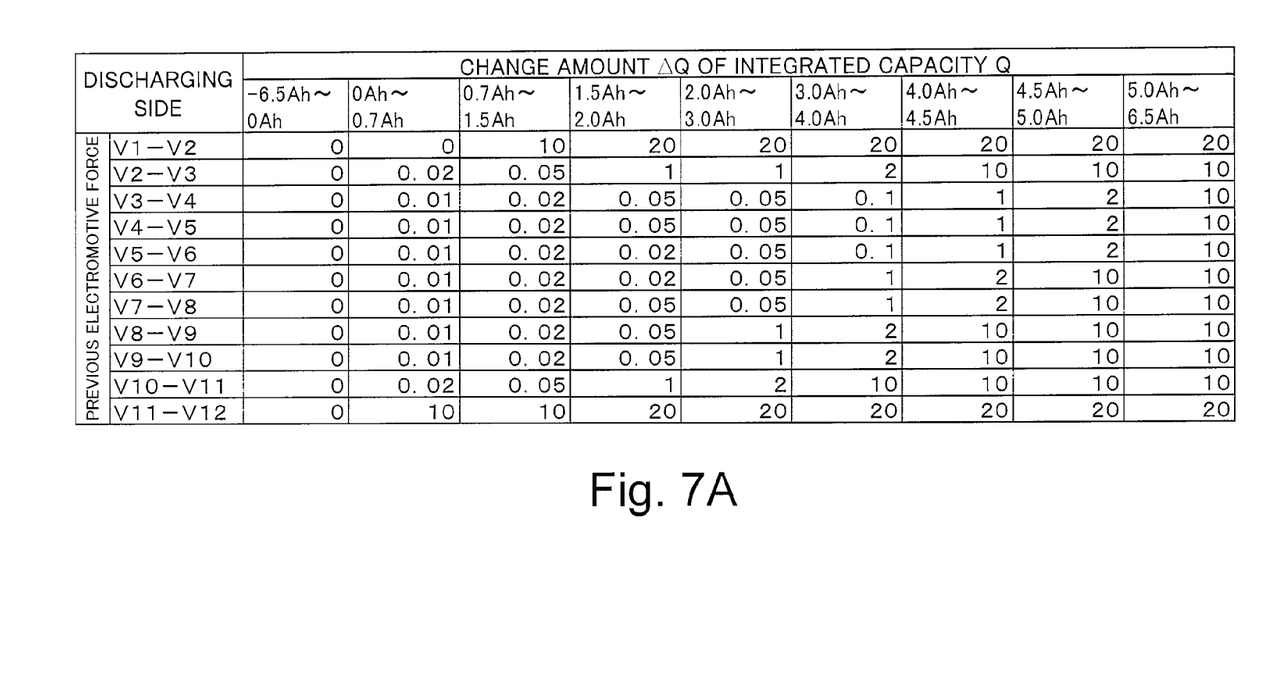
FIG. 7A shows an example of a reference table during discharging to be referenced when determining a change limiting value Vt.
Figure 7B:
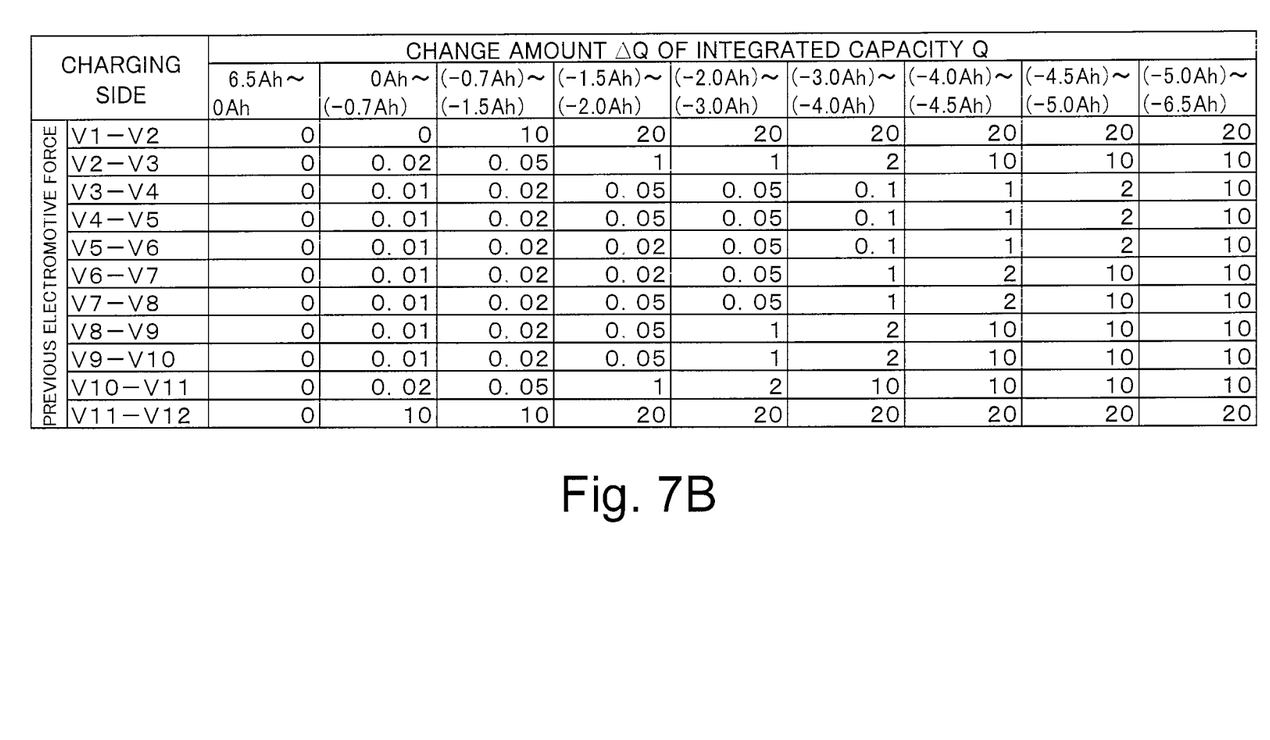
FIG. 7B shows an example of a reference table during charging to be referenced when determining the change limiting value Vt.

In the embodiment, the electromotive force correcting section 217 determines the change limiting value Vt on the basis of lookup tables (LUT) shown in FIG. 7A and FIG. 7B. FIG. 7A is the lookup table to be referenced during discharging and FIG. 7B is the lookup table to be referenced during charging. As shown in FIG. 7A and FIG. 7B, the change limiting value Vt can be obtained with the magnitude of the previous electromotive force Veb and the change amount $\Delta Q$ as parameters. For example, in FIG. 7A, if the magnitude of the previous electromotive force Feb is between V5 and V6 and the change amount $\Delta Q$ is between 1.5 Ah and 2.0 Ah, the change limiting value Vt at this time becomes 0.02 V.

Figure 8:
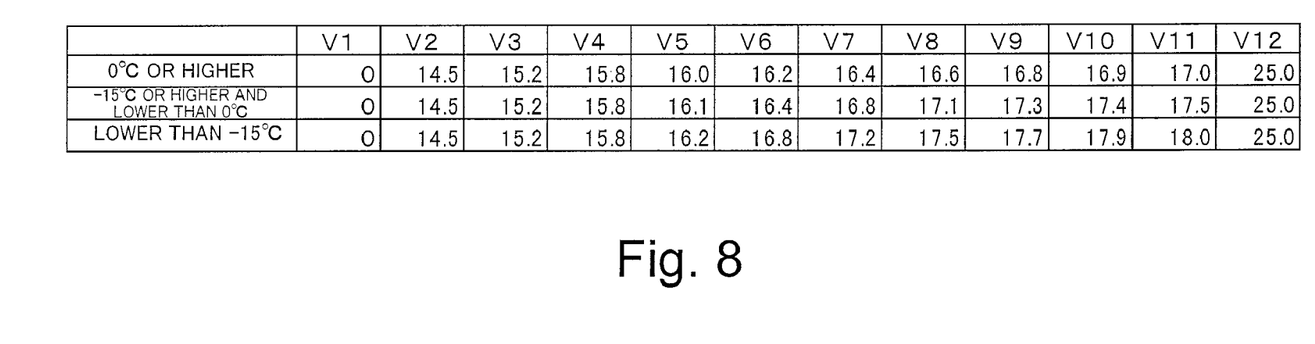
FIG. 8 shows an example of a reference table to be referenced when setting the magnitude of a previous electromotive force Veb corresponding to the respective change limiting value Vt.

Furthermore, the hypothetical change amount of the electromotive force differs depending on battery temperature. For example, the change amount of the electromotive force in a state where the SOC is high at a low temperature (−30° C.) is large compared to the change amount of the electromotive force at room temperature (25° C.). Therefore, it is preferable to also change the change limiting value Vt depending on battery temperature. As shown in FIG. 8, the magnitude of the previous electromotive force Veb with respect to various change limiting values Vt may be changed depending on battery temperature. For example, when the battery temperature 0° C. or higher, V5 is set to 16.0 V and V6 is set to 16.2 V in the lookup tables shown in FIG. 7A and FIG. 7B, and when the battery temperature is greater than or equal to −15° C. and less than 0, V5 is set to 16.1 V and V6 is set to 16.4 V.

As shown hereinabove, even if a temporal deviation develops between the no-load voltage V0 and the polarized voltage Vp, an error in the electromotive force Ve calculated on the basis thereof can be suppressed by correcting the electromotive force Ve in the electromotive force correcting section 217.

As described hereinabove, the change amount of the electromotive force Ve depends on the change amount of the SOC. Thus, for example, a lookup table (LUT) showing a correlation between the SOC and the change limiting value Vt may be prepared in advance and the change limiting value Vt may be set in accordance with the magnitude of the SOC by referencing the lookup table.

As described hereinabove, the electromotive force Ve', which was corrected and output by the electromotive force correcting section 217, is input by the previous electromotive force storage section 218 and by a current integrating factor correcting section 220. When a new electromotive force Ve' is input, the previous electromotive force storage section 218 rewrites the presently stored previous electromotive force Veb with the newly input electromotive force Ve'. Furthermore, the current integrating factor correcting section 220 determines a correction amount α with respect to the current integrating factor k in accordance with the electromotive force Ve'. The correction amount α with respect to the electromotive force Ve' is expressed as a linear expression and this linear expression is determined with convergence of the system taking into consideration. The correction amount α obtained by the current integrating factor correcting section 220 is added to, subtracted from, or multiplied with the charging efficiency η output from a charging efficiency calculating section 222 by an adder 224 to yield the current integrating factor k.

The current integrating factor k from the adder 224 is input by an SOC estimating section 230. At the SOC estimating section 230, the current integrating factor k is multiplied with the current data I(n) from the current measuring section 204 and a residual capacity SOC is estimated by integrating the current over a predetermined period.

Furthermore, the estimated value of the SOC is input by the above-mentioned charging efficiency calculating section 222, and at the charging efficiency calculating section 222, the charging efficiency η is calculated on the basis of the temperature data T(n) measured by the temperature measuring section 206 from the characteristic curve of the charging efficiency η with respect to the SOC estimated value with temperature as a parameter stored in advance. If the secondary battery 10 is in a discharged state, the charging efficiency η is fixed at 1, and if the secondary battery 10 is in a charged state, the charging efficiency η calculated from the charging efficiency calculating section 222 is used.

As described hereinabove, the various parts provided within the battery ECU 20 execute respective processes so that the battery ECU 20 estimates the SOC of the secondary battery 10 on the basis of the temperature data Tb(n), terminal voltage data Vb(n), and current data I(n) output from the temperature sensor 32, voltage sensor 34, and current sensor 36.

Next, the procedure when the battery ECU 20 configured in the above-mentioned manner estimates the SOC of the secondary battery will be described with reference to the flowchart of FIG. 9.

Figure 9:
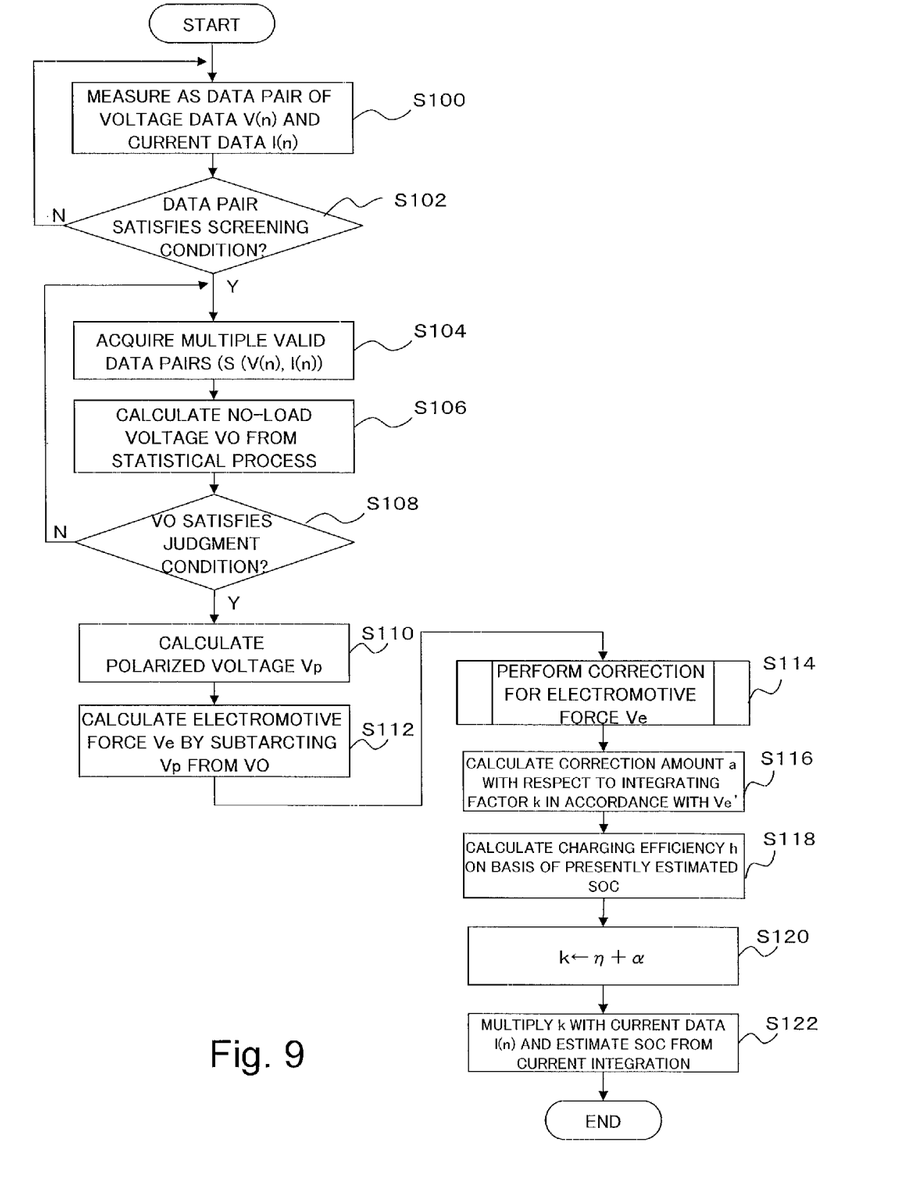
FIG. 9 is a flowchart showing a procedure to be executed when the battery ECU estimates the SOC of the secondary battery in the embodiment.

In FIG. 9, first, the voltage data V(n) and current data I(n) are measured (S100) as a data pair. Next, to check whether or not the data pair of voltage data V(n) and current data I(n) measured in step S100 is a valid data pair, it is judged (S102) whether or not the data pair satisfies the screening condition as described hereinabove. In the judgment of step S102, if the screening condition is not satisfied (judgment result of step S102 is a negative "N"), the execution returns to step S100 and the data pair of voltage data V(n) and current data I(n) is again measured. On the other hand, if the screening condition is satisfied in the judgment of step S102 (judgment result of step S102 is an affirmative "Y"), multiple (for example, 10 pairs each in the charging and discharging directions among 60 samples) valid data pairs of S(V(n),I(n)) are acquired (S104).

Next, a statistical process using a method of least squares from the valid pair data S(V(n),I(n)) obtains a primary approximation line (V-I line) and calculates (S106) the V intercept of the approximation line as the no-load voltage V0. Next, to determine whether or not the no-load voltage V0 is valid, it is judged (S108) whether or not the no-load voltage V0 satisfies the judgment condition as described hereinabove. In the judgment of step S108, if the judgment condition is not satisfied (judgment result of step S101 is a negative "N"), the execution returns to step S104, other multiple (for example, other 10 pairs each among 60 samples) valid data pairs (S(V(n),I(n)) are acquired, and steps S104 and S106 are repeated. On the other hand, in the judgment of step S108, if the calculated no-load voltage V0 satisfies the judgment condition (judgment result of step S108 is an affirmative "Y"), the calculated no-load voltage V0 is used in the calculation of the electromotive force Ve.

Next, the integrated capacity Q in a past predetermined period (for example, 60 seconds) is calculated from the current data I(n) measured in step S100 and the polarized voltage Vp is calculated (S110) as described hereinabove on the basis of the integrated capacity Q. Next, by subtracting the polarized voltage Vp from the no-load voltage V0, the electromotive force Ve is calculated (S112) and further the correction process for the electromotive force Ve is executed (S114).

Figure 10:
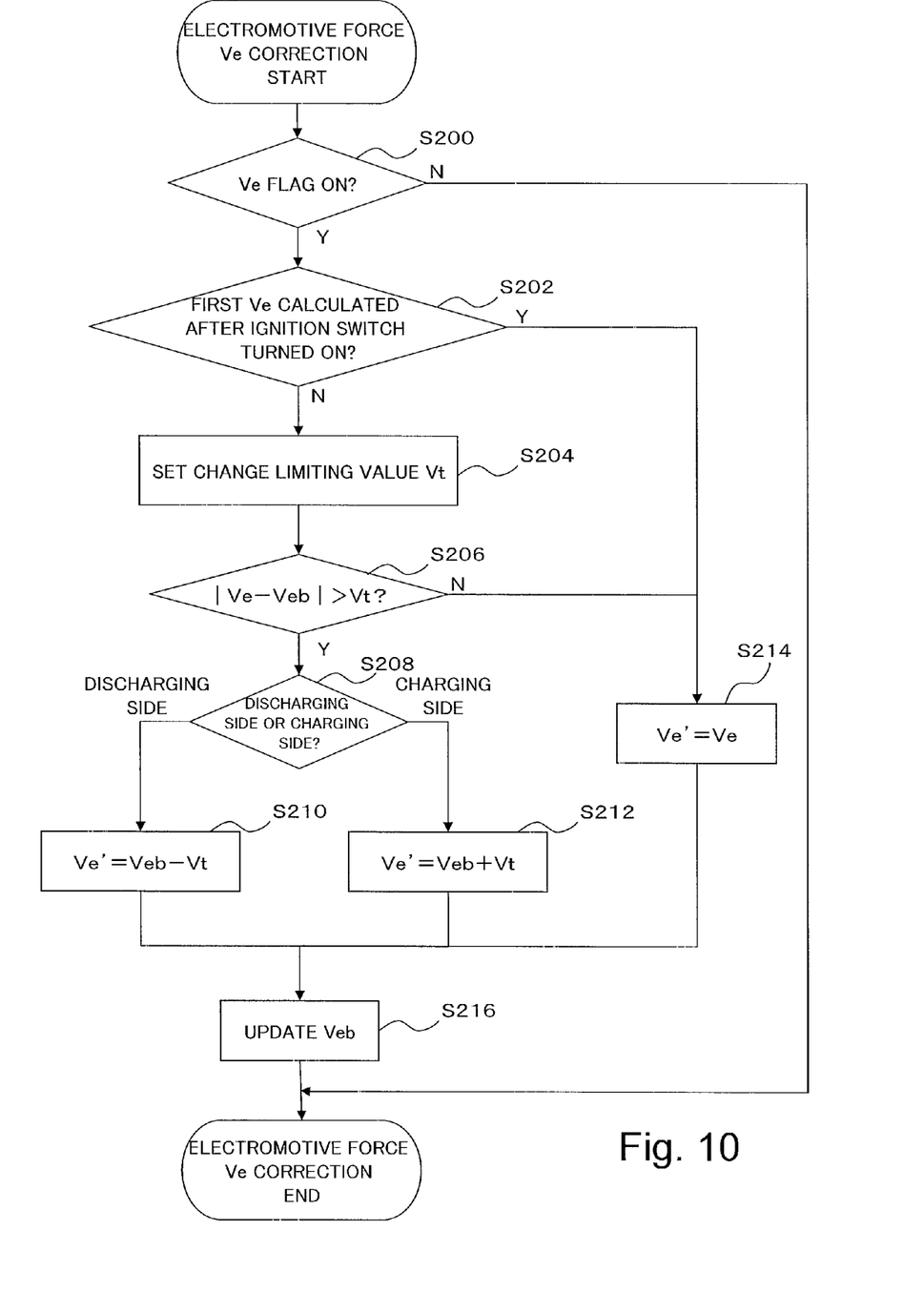
FIG. 10 is a flowchart showing a procedure to be executed when the battery ECU performs correction of the electromotive force in the embodiment.

Here, the procedure for the correction process for the electromotive force Ve will be described with reference to the flowchart shown in FIG. 10.

First, a judgment of whether or not a Ve flag is on is performed to judge (S200) whether or not the electromotive force Ve has been calculated. Here, the Ve flag turns on when the electromotive force Ve is calculated. As described hereinabove, to calculate the electromotive force Ve, it is necessary to calculate the no-load voltage V0, and the no-load voltage V0 is obtained from a statistical process using multiple data pairs of terminal voltage V and current I. Namely, the no-load voltage V0 is not always calculated. First, it is judged whether or not the Ve flag is on. Then, if the Ve flag is off (judgment result of step S200 is a negative "N"), the process terminates.

On the other hand, if the Ve flag is on (judgment result of step S200 is an affirmative "Y"), it is next judged (S202) whether or not the electromotive force Ve for correction is the first electromotive force calculated after the ignition switch is turned on. As a result of the judgment, if it is the first (judgment result of step S202 is an affirmative "Y"), a previous electromotive force Ve does not exist so that correction of the electromotive force Ve is not performed (S214) and the process terminates.

On the other hand, if it is not the first (judgment result of step S202 is a negative "N"), the change limiting value Vt is set (S204) on the basis of the magnitude of the previous electromotive force Veb, the change amount ΔQ of the integrated capacity Q, and the temperature data T(n) as described hereinabove.

Next, it is judged (S206) whether or not the absolute value (|Ve−Veb|) of a value, which is the previous electromotive force Veb subtracted from the electromotive force Ve, exceeds the change limiting value Vt. If the change limiting value Vt is not exceeded, correction of the electromotive force Ve is not performed (S214) and the process terminates.

On the other hand, if the change limiting value Vt is exceeded, it is judged (S208) whether the electromotive force Ve was calculated when the secondary battery 10 was discharging or charging. As a result of the judgment, if the calculation was performed during discharging, the post-correction electromotive force Ve' is Veb−Vt (S210). If the calculation was performed during charging, the post-correction electromotive force Ve' is Veb+Vt (S212).

As described hereinabove, after the post-correction electromotive force Ve' is obtained, the previous electromotive force Veb stored in the previous electromotive force storage section 218 is replaced by the post-correction electromotive force Ve' to update (S216) the previous electromotive force Veb and the correction process for the electromotive force Ve terminates.

Returning back to FIG. 9, after the correction process for the electromotive force Ve is performed as described hereinabove, the correction amount α with respect to the current integrating factor k is calculated (S116) in accordance with the post-correction electromotive force Ve'. Furthermore, the charging efficiency η is calculated (S118) from the present estimated value of the SOC on the basis of the measured temperature data T(n). Next, the correction amount α obtained in step S118 and the charging efficiency η obtained in step S120 are added to calculate (S120) the current integrating factor k. Finally, the current integrating factor k is multiplied with the current data I(n) and the SOC is estimated (S122) from current integration in a predetermined period.

As described hereinabove, according to the embodiment, correction is performed with respect to the electromotive force Ve obtained by subtracting the polarized voltage Vp from the no-load voltage V0 so that the allowable change amount is not exceeded with the previous electromotive force Veb as reference. As a result, an error in the electromotive force Ve developed from a temporal deviation between the no-load voltage V0 and the polarized voltage Vp can be suppressed. Thus, the accuracy of the SOC estimated on the basis of the electromotive force Ve can be improved.

Although the above-mentioned embodiment exemplifies a case for estimating the SOC on the basis of the computed electromotive force, the electromotive force may be used in applications other than as a parameter for estimating the SOC.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. An electromotive force computing device comprising:
an electromotive force computing section for computing an electromotive force of a secondary battery with time on the basis of a no-load voltage V0 expressing a terminal voltage of said secondary battery when current flowing to said secondary battery is zero and a polarized voltage Vp of said secondary battery; and
an electromotive force correcting section for correcting an electromotive force Ve so that a change amount does not exceed a predetermined limiting value Vt when said change amount of said electromotive force Ve presently computed with respect to a previously computed electromotive force Veb exceeds said limiting value Vt.

2. An electromotive force computing device according to claim 1, wherein said electromotive force computing section comprising:
a no-load voltage computing section for acquiring over a predetermined period a plurality of data pairs of a current I flowing to said secondary battery and a terminal voltage V of said secondary battery with respect to said current I and computing said no-load voltage V0 from statistical processing on the basis of the acquired plurality of data pairs; and
a polarized voltage computing section for calculating an integrated capacity Q by integrating said current I over said predetermined period and for computing said polarized voltage Vp on the basis of an integrated capacity change amount ΔQ, which is a difference with a previous integrated capacity Q.

3. An electromotive force computing device according to claim 1, wherein said electromotive force correcting section performs correction by:
adding said limiting value Vt to said electromotive force Veb when said secondary battery is charging; and
subtracting said limiting value Vt from said electromotive force Veb when said secondary battery is discharging.

4. An electromotive force computing device according to claim 1, wherein:
said electromotive force correcting section sets said limiting value Vt with at least one of said electromotive force Veb, change amount ΔQ of integrated capacity Q of said secondary battery in said predetermined period, battery temperature of said secondary battery, or state of charge of said secondary battery as a parameter.

5. An electromotive force computing device comprising:
an electromotive force computing section for computing electromotive force of a secondary battery with time on the basis of a no-load voltage V0 expressing a terminal voltage of said secondary battery when current flowing to said secondary battery is zero and a polarized voltage Vp of said secondary battery, wherein charging or discharging of said secondary battery is controlled so that a state of charge is maintained in a predetermined allowable range; and an electromotive correcting section for correcting said electromotive force Ve so that a change amount of said electromotive force Ve presently computed with respect to an electromotive force Veb previously computed does not exceed a limiting value Vt set in accordance with the state of charge of said secondary battery, wherein Vt is not equal to zero.

6. A state of charge estimating device for estimating the state of charge of a secondary battery on the basis of electromotive force of said secondary battery acquired from an electromotive force computing device according to claim 1, wherein:
state of charge of said secondary battery is estimated on the basis of a post-correction electromotive force Ve' when said change amount of electromotive force exceeds said limiting value Vt; and
state of charge of said secondary battery is estimated on the basis of said electromotive force Ve when said change amount of electromotive force does not exceed said limiting value Vt.

* * * * *